United States Patent [19]

Beaumont

[11] Patent Number: 4,600,859
[45] Date of Patent: Jul. 15, 1986

[54] CATHODE RAY TUBE PROTECTION SYSTEMS

[75] Inventor: Gregory J. Beaumont, Arlington Heights, Ill.

[73] Assignee: Zenith Electronics Corporation, Glenview, Ill.

[21] Appl. No.: 601,779

[22] Filed: Apr. 19, 1984

[51] Int. Cl.⁴ .................... H01J 21/20; H02H 1/00
[52] U.S. Cl. ..................................... 315/3; 313/325; 361/120; 361/129
[58] Field of Search ............... 315/3, 1; 361/111, 117, 361/120, 129; 313/325

[56] References Cited

U.S. PATENT DOCUMENTS

| | | | |
|---|---|---|---|
| 3,683,228 | 8/1972 | Kleen | 313/325 X |
| 3,865,452 | 2/1975 | Pittman | 313/325 X |
| 4,199,215 | 4/1980 | Pittman | 313/325 X |
| 4,266,158 | 5/1981 | Uda et al. | 361/129 X |
| 4,298,815 | 11/1981 | Ishihara et al. | 361/129 X |
| 4,345,185 | 8/1982 | Kobori | 315/3 |
| 4,400,645 | 8/1983 | Simovits, Jr. et al. | 313/325 |
| 4,491,764 | 1/1985 | D'Amato | 315/3 |

Primary Examiner—David K. Moore
Assistant Examiner—Vincent DeLuca

[57] ABSTRACT

A socket assembly for a CRT includes a socket mounted on a printed circuit board having a plurality of spark gaps interposed between an open grounding ring and the terminals of the socket. The spark gaps associated with the cathode and heater socket terminals have larger width dimensions than those associated with the other electrode terminals and are positioned adjacent to the portion of the open grounding ring farthest from the connection to the CRT "dag".

8 Claims, 5 Drawing Figures

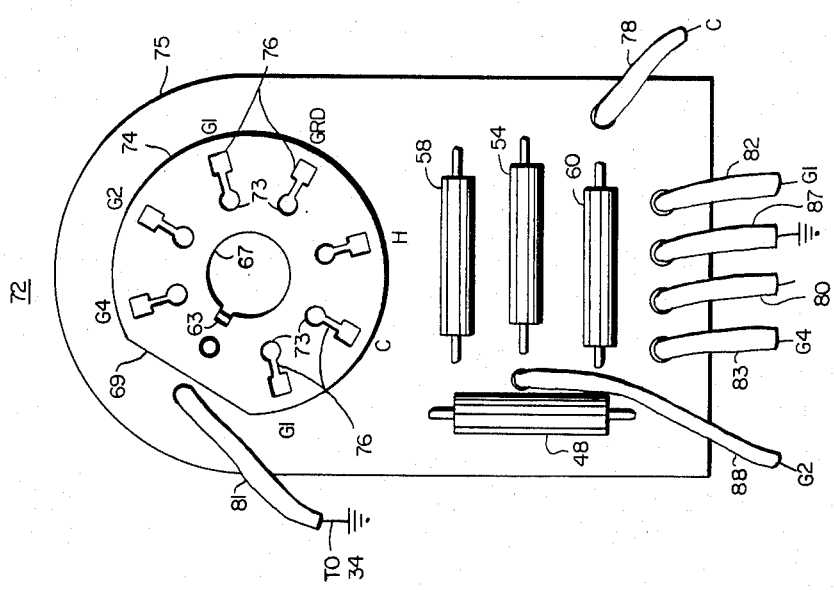

CATHODE RAY TUBE PROTECTION SYSTEMS

This invention relates generally to cathode ray tubes (CRT's) and particularly to means for protecting circuits associated with the CRT from occasional high voltage arcs that may be generated within the CRT.

BACKGROUND OF THE INVENTION AND PRIOR ART

CRT's are well known in the art and include a plurality of electron beam forming elements (electron gun) situated in the neck of an evacuated envelope, generally made of glass. The electron beam is directed to a phosphor viewing screen formed on the inner surface of an enlarged funnel shaped portion of the envelope connected to the neck. The electron gun elements are cup-shaped grid electrodes positioned in close proximity to each other and to an electrically heated cathode that has been treated to enhance its ability to give off electrons. Some of the electrodes in the electron gun serve to focus and accelerate the electron beam. A control electrode affects the intensity or modulation of the beam in accordance with an input video signal. The CRT is supplied with a high voltage, on the order of 12 KV for small monochrome CRT's, which is applied to an electron permeable conductive coating applied over the phosphor screen and to an inner conductive coating on the funnel portion of the tube envelope. The high voltage, which is also internally supplied to one or more of the electrodes in the electron gun, is brought into the envelope through an anode button sealed into the tube wall. The outer surface of the envelope is coated with a conductive material commonly referred to as "dag" coating. This outer coating is connected to ground. Thus, not only is the high voltage supplied to the CRT, but the glass envelope of the CRT functions as the dielectric of a capacitor having plates formed by the inner conductive coating and the outer "dag" coating. This high voltage capacitor is useful for filtering the output of the high voltage power supply.

As is well known, CRT manufacture is a relatively complex undertaking. One major task is to assure that the elements used in fabrication are free of contaminants and minute dirt particles. A "dirty" tube is prone to internal arcing, especially in the areas of the closely spaced gun electrodes. The resultant heavy discharges of electrical energy between the high voltage electrodes in the tube and the neighboring lower voltage electrodes can be very destructive, not only to the tube elements, but also to the associated circuitry. While precautions are taken during manufacture to eliminate such particles, including a technique known as "spot knocking" involving vaporizing contaminant particles with high voltage energy, occasional arcs usually occur during normal tube operation. It is imperative that precautions be taken to protect the cathode and heater gun electrodes and their surrounding low impedance circuits from the effects of such arcs.

While the high voltage is coupled through the wall of the CRT, the lower DC voltages and signal voltages are supplied to connection pins that are embedded in the base of the tube neck. It is also well known to provide arc protection in the base socket that connects the external circuitry to the CRT pins. Many forms of arc protection are used in the prior art, a common one being air gaps located between the electrodes of the CRT and a ground connection. It is also well known to mount the CRT socket on a printed circuit board which may carry some of the resistors that are connected between the CRT pins and their supply circuits. The printed circuit board has also been used to define the spark gaps with the CRT socket connectors being terminated to the printed circuit board and to conductive foil strips interconnecting the terminations with a ground connection, generally the picture tube dag coating. The spark gaps are formed in the foil strips by physically removing portions of the printed circuit board and foil thereby breaking the connection between the socket connectors and ground. Despite such precautions, it has been observed that a large number of arcs occur to the cathode and heater electrodes which, because of their relatively remote position from the high voltage electrodes in the electron gun structure, should be considered least susceptible to arcs.

Applicant has determined that the cathode and heater structures rarely receive "primary" arcs, but rather are subjected to "secondary" arcs, that is arcs created by failure to discharge the primary arc energy quickly enough.

OBJECTS OF THE INVENTION

A principal object of this invention is to provide an improved arc protection system for a CRT.

Another object of this invention is to provide an improved arc protecting CRT socket assembly.

A further object of this invention is to enhance arc protection for low impedance circuits coupled to a CRT.

SUMMARY OF THE INVENTION

In accordance with the invention, a CRT socket assembly for use with a CRT having an electron gun including electrodes susceptible to high voltage arcing, includes means in the socket activated in the presence of abnormal high voltage for providing an energy discharge path, the means being configured such that low impedance circuits coupled to the CRT are less likely to receive discharge energy than high impedance circuits coupled to the CRT.

BRIEF DESCRIPTION OF THE DRAWINGS

Other objects and advantages of the invention will be apparent upon reading the following description in conjunction with the drawings in which:

FIG. 2 is a plan view of a socket assembly adapted for connection to the base pins of a CRT;

FIG. 3 is a rear view of the socket assembly of FIG. 2;

DESCRIPTION OF THE PREFERRED EMBODIMENT

Figure 1:
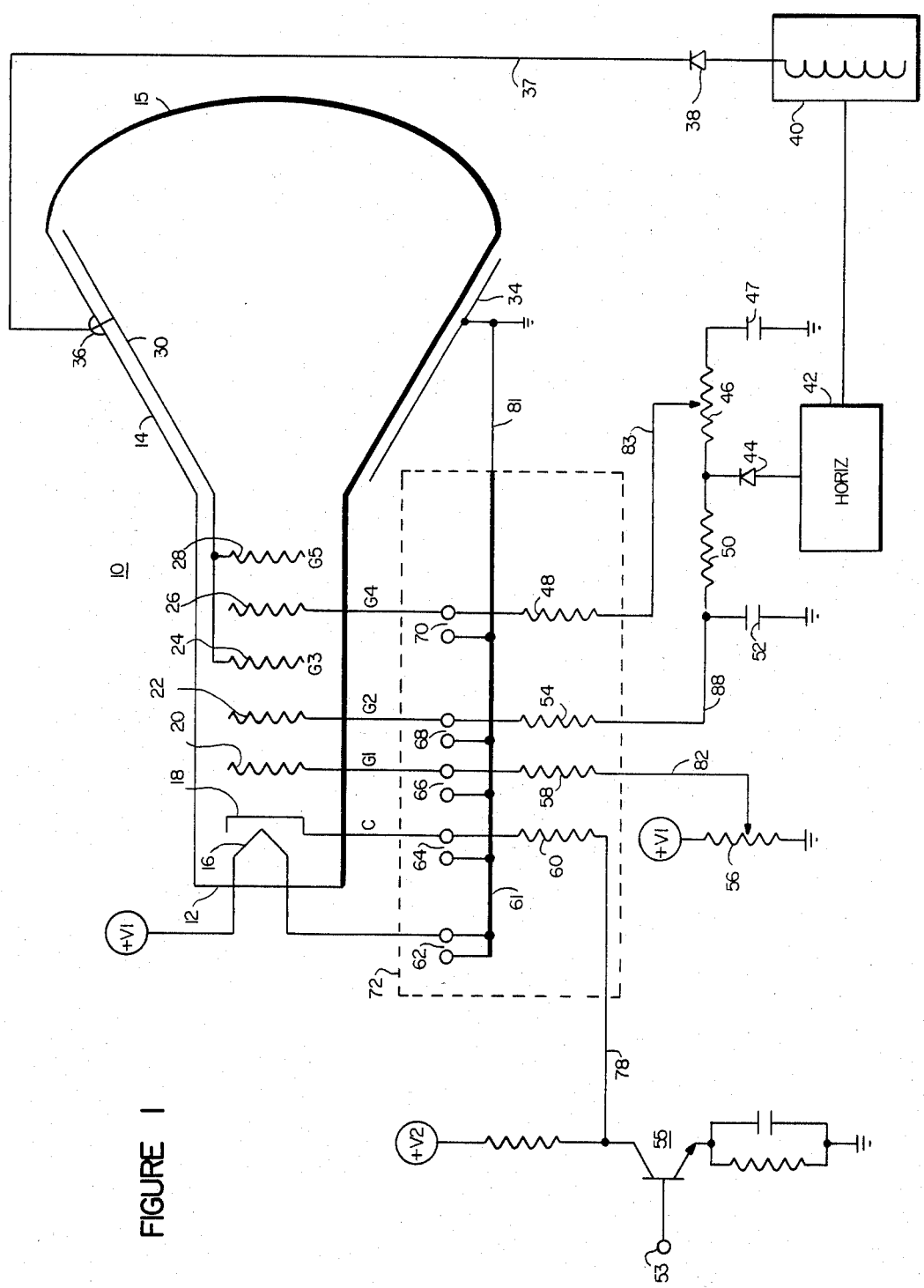
FIG. 1 is a partial schematic diagram of a CRT arc protection circuit.

FIG. 1 illustrates a CRT 10 having an envelope including a generally cylindrical neck portion 12 connected to a flared funnel portion 14 terminating in a large viewing screen 15. A heater electrode 16 is situated at one end of the neck of CRT 10 and adapted to be heated by a source of electric energy, such as a voltage +V1. Closely adjacent to heater 16 is a cathode electrode 18 having a specially treated surface for generating or "boiling off" electrons when heated by heater 16. A first grid electrode 20 (G1) is positioned closely adjacent to cathode 18. A second grid electrode 22 (G2) is similarly positioned with respect to grid 20. Three more grid electrodes 24, 26, and 28 (G3, G4, and G5, respectively) are arranged to provide focusing and acceleration for the electron beam produced. An internal conductive coating 30, which may be vapor deposited aluminum, is formed on the inner surface of the envelope of the CRT 10 and is coupled to grid electrodes 24 and 28. Coating 30 is also coupled through the wall of CRT 10 to an anode button 36 for making connection to a high voltage energy source. The outer surface of the CRT funnel is coated with a conductive material 34, commonly referred to as "dag", which is connected to ground potential. Suitable DC high voltage is applied to CRT 10 via anode button 36 by means of a high voltage lead 37 connected to a diode 38 that is in turn connected to a high voltage source 40. High voltage source 40 is driven by a horizontal circuit 42. It will be appreciated that the horizontal circuit, the high voltage source and the CRT are all well known in the art and thus need no detailed description.

Another output of horizontal circuit 42 is applied to a diode 44 and to the junction of a focus potentiometer 46 and a large resistor 50. The other end of potentiometer 46 is connected to ground via a capacitor 47 and the movable slider thereon is connected through a large resistor 48 to G4 electrode 26. The other end of a resistor 50 is connected to ground through a capacitor 52 and in series with a larger resistor 54 which is connected in series with G2 electrode 22. Those skilled in the art appreciate that grid electrode 22 is supplied with a moderate DC potential for acceleration of the electron beam and grid electrode 26 is similarly supplied with a moderate DC potential that is variable for focusing the electron beam. The G3 electrode 24 and G5 electrode 28 are connected internally to inner conductive coating 30, which is supplied with high voltage DC potential.

Another potentiometer 56, used for controlling brightness of the CRT, is connected between +V2 and ground and has its slider connected through a large resistor 58 to G1 electrode 20. Cathode 18 is connected through a very small resistor 60 to the collector of a transistor 55 which has its base electrode supplied with a video signal at an input terminal 53. Transistor 55 is shown as part of a well known low impedance circuit connected between +V2 and ground. A grounding ring 61 (shown as a heavy straight line) has a plurality of projections extending close to the wires leading to the CRT electrodes to form a plurality of spark gaps 62, 64, 66, 68, and 70 therewith. As will be seen, the wires to the electrodes are actually pins extending from the base of the CRT and adapted to make connection with the terminals of a socket. The spark gaps are diagrammatically indicated in the drawings and will be seen to be apertures or cut-outs in a printed circuit board. The structure, including the spark gaps and resistors 48, 54, 58, and 60 are enclosed by a dashed line block 72 which represents the socket assembly, as will be described below.

In a small monochrome CRT monitor, the high voltage applied through anode button 36 is, as mentioned, on the order of 12 KV and is also internally applied to grids G3 and G5. The voltages applied to grids G2 and G4 are substantially less than 12 KV but greater than those applied to grid G1 and to the cathode. While these schematic diagrams do not accurately portray the placement of the electrodes with respect to each other, it is generally true that the greatest likelihood of arcing occurs between G3/G5 and G4. The next most likely occurrence is from G3 to G2. The likelihood of breakdown to G1 is quite small and the cathode circuit is subject to very few, if any, arc discharges. However field experience has been to the contrary with the cathode electrode and associated circuitry experiencing an unacceptable number of failures resulting from energy dissipation due to arcing. It was discovered that the cathode circuit was being subjected to "secondary" arcing rather than "primary" arcing. Thus, a primary arc to one of the other electrodes would result in a relatively large current which would give rise to a momentary large voltage on the grounding ring. The resulting voltage was sufficient to cause a reverse breakdown of the spark protection gap coupled to the cathode causing the low impedance cathode circuitry to fail. The circuits connected to the other electrodes include relatively large series resistors and were thus substantially immune to the phenomenon.

In FIG. 2 a plan view of a socket assembly for use with a CRT is shown. Assembly 72 consists of a socket 74, constructed of good quality insulating material, and supported on a printed circuit board 75 by means of a plurality of terminals 76. These terminals are carried by socket 74 and are adapted to be secured in suitable apertures in the printed circuit board and soldered to pads, that is, bits of conductive foil supported on the board. The terminals also include sleeve connector portions 73 for making good mechanical electrical connections to the pins extending through the base of the CRT. The socket has an inner circular hole 67 with a locating key 63 formed therein. The printed circuit board includes an extended portion having resistors 48, 54, 58, and 60 mounted thereon as well as means for terminating connecting wires 78, 81, 82, 83, 87, and 88.

As best seen in FIG. 3, which is a rear view of the socket assembly of FIG. 2, conductive foil sections 79, supported on the circuit board, interconnect the wires, resistors and socket terminals. In particular, open grounding ring 61, formed of conductive foil, surrounds an aperture in the printed circuit board that is in alignment with aperture 67 in the socket. Grounding ring 61 is connected by short radially extending foil elements to the various solder pads for the socket terminals. These foil elements are broken, that is, made discontinuous, by a plurality of generally "dumbbell" shaped cutouts 62, 64, 66, 68, and 70 in the printed circuit board. The cutouts provide an air gap between grounding ring 61 and each of the socket terminals, with the exception of conductive element 65 which is connected to ground by means of lead 87. For ease of identification, the terminals and leads are labelled C (cathode, H (heater), G1, G2, G4, and GRD (ground). It will be appreciated that G1 appears at two different locations since there is an internal connection in the CRT between the two corresponding pins. G3 and G5, of course, do not receive voltage through the base of the CRT.

Figure 4:
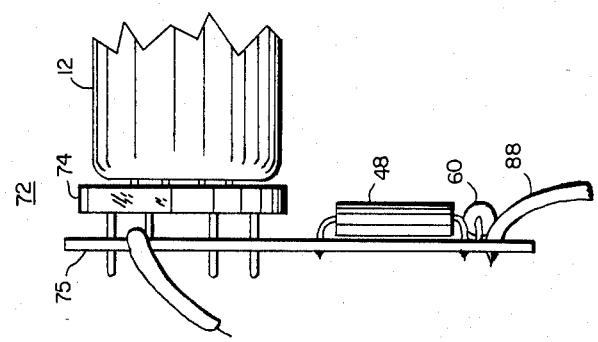
FIG. 4 is a partial side view of the socket assembly mounted to the base of the CRT.

FIG. 4 is a side view illustrating the arrangement of the socket assembly with respect to the base of the CRT. The mounting of resistors 48 and 60 and the position of leads 81 and 88 are clearly depicted and are representative of mounting and location of the other components and leads.

Figure 5:
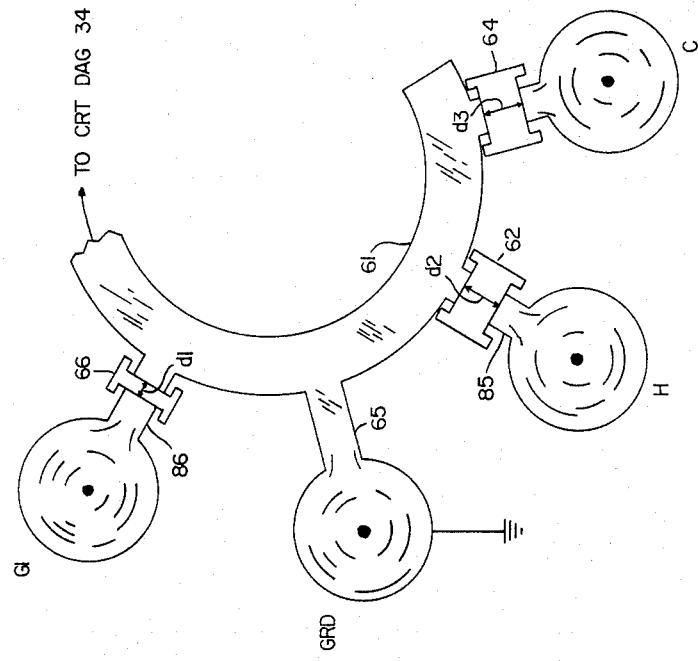
FIG. 5 is a partial plan view illustrating the application of the invention.

FIG. 5 is a partial illustration of a portion of grounding ring 61 and the pads for the socket terminals. As is clearly seen, the spark gap cutouts 62, 64, and 66 are all approximately the same length but cutout 66 has a width d1 whereas cutouts 62 and 64 have widths d2 and d3 respectively. In practice, d1 is approximately 0.020" whereas d2 and d3 are about three times that or 0.060". The wider gaps are used in conjunction with the heater and cathode electrodes since the circuits connected to these electrodes have very low impedance and therefore have limited ability to dissipate arc energy safely. In practice, an arc to any of the electrodes G1, G2, or G4 could result in a large current flow in grounding ring 61 with consequent development thereon of an instantaneous voltage of very substantial magnitude. This developed voltage is often sufficiently high to break down the spark gap associated with the low impedance cathode and heater circuits in the prior art sockets. By making these spark gaps substantially larger than the other spark gaps and by locating the cathode and heater terminals at a point on the grounding ring remote from the connection to the CRT "dag", secondary arcing is avoided since the gaps are big enough to preclude reverse breakdown for the normal instantaneous voltage increases experienced at these locations on the grounding ring during an arcing condition. However, should an arc occur to the cathode or heater electrodes, their associated spark gaps would break down to protect these electrodes and their associated circuits. With the circuit of the invention, the heater/cathode problems due to arcing have been significantly reduced.

It is recognized that numerous modifications and changes in the described embodiment of the invention will become apparent to those skilled in the art without departing from the true spirit and scope thereof. The invention is to be limited only as defined in the claims.

What is claimed is:

1. A socket assembly for a CRT having a conductive "dag" and including an electron gun having electrodes susceptible to high voltage arcing comprising;
   a plurality of spark gap means in said socket assembly, at least a first of said spark gap means being activated in the presence of abnormal high voltage for providing an energy discharge path for a high voltage arc; and
   a second of said spark gap means being larger than said first spark gap means such that a low impedance circuit associated therewith is precluded from a secondary discharge of energy as a result of said arc.

2. The assembly of claim 1 wherein said low impedance circuit is coupled to the cathode electrode of said CRT.

3. The assembly of claim 2, further including a printed circuit board having a conductive grounding ring and a CRT socket mounted thereon and wherein said spark gap means define apertures in said printed circuit board interrupting conductive foil elements extending from said socket to said grounding ring.

4. The assembly of claim 3 wherein said grounding ring is open and includes a connection to the CRT "dag" and wherein said second spark gap means associated with said cathode electrode is near the end of said open grounding ring remote from said connection.

5. The assembly of claim 4 including a heater electrode being coupled to another low impedance circuit having an associated spark gap means that is larger than said first spark gap means.

6. In a CRT socket assembly of the type including a socket mounted to a printed circuit board having an open conductive ring for protecting the socket terminals from high voltage arcs occurring in the CRT, said CRT including a conductive "dag" coating thereon, and said socket assembly including a plurality of spark gaps, defined by cutouts in the printed circuit board, interrupting the electrical paths between the grounding ring and the terminals, the improvement comprising:
   a larger spark gap associated with at least one of the socket terminals than the size of the spark gap associated with another of said socket terminals to prevent said larger spark gap from breaking down in the presence of an arc in a spark gap associated with said another socket terminal.

7. The assembly of claim 6 wherein that one socket terminal is connected to the cathode electrode in the CRT and wherein the open grounding ring is connected at one end to the CRT "dag", the spark gap for the one terminal being located on the grounding ring farther away from the "dag" connection point than the others of the socket terminals.

8. A socket assembly for use with a CRT having a conductive "dag" coating and including a printed circuit board having cutout spark gaps associated with the terminals of said socket for breaking down in the presence of high voltage across the terminals and an open grounding ring on the board, said grounding ring having a connection point connected to said "dag," the spark gap associated with the cathode of said CRT being substantially larger than the spark gaps associated with others of said terminals and being located adjacent to said open grounding ring farther from said connection point than said others of said terminals.

* * * * *